United States Patent
Joshi et al.

(10) Patent No.: US 10,804,236 B2
(45) Date of Patent: Oct. 13, 2020

(54) POWER ELECTRONIC ASSEMBLIES WITH HIGH PURITY ALUMINUM PLATED SUBSTRATES

(71) Applicant: Toyota Motor Engineering & Manufacturing North America, Inc., Plano, TX (US)

(72) Inventors: Shailesh N. Joshi, Ann Arbor, MI (US); Naoya Take, Canton, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 41 days.

(21) Appl. No.: 16/170,432

(22) Filed: Oct. 25, 2018

(65) Prior Publication Data

US 2020/0135681 A1 Apr. 30, 2020

(51) Int. Cl.
*H01L 23/00* (2006.01)
*H01L 23/373* (2006.01)
*H05K 7/20* (2006.01)

(52) U.S. Cl.
CPC .......... *H01L 24/32* (2013.01); *H01L 23/3736* (2013.01); *H01L 23/562* (2013.01); *H01L 24/27* (2013.01); *H01L 24/29* (2013.01); *H01L 24/83* (2013.01); *H05K 7/209* (2013.01); *H01L 24/33* (2013.01); *H01L 24/48* (2013.01); *H01L 24/73* (2013.01); *H01L 2224/27462* (2013.01); *H01L 2224/29082* (2013.01); *H01L 2224/29083* (2013.01); *H01L 2224/29124* (2013.01);
(Continued)

(58) Field of Classification Search
CPC ... H01L 21/02697; H01L 24/32; H01L 24/29; H01L 24/83; H01L 24/27
See application file for complete search history.

(56) References Cited

U.S. PATENT DOCUMENTS 9,401,340 B2   7/2016  Nishimoto et al.
9,620,434 B1   4/2017  Joshi et al.
(Continued)

FOREIGN PATENT DOCUMENTS

CN    103266233 A    8/2013
JP    2016143830 A   8/2016
WO    2017024854 A1  2/2017

OTHER PUBLICATIONS

Cooke,, et al "Effect of Ni—Al2O3 nano composite coating thickness on transient liquid phase bonding of Al6061 MMC" https://www.tandfonline.com/doi/abs/10.1179/1362171811Y.0000000069 Nov. 12, 2013.

(Continued)

*Primary Examiner* — Douglas M Menz
(74) *Attorney, Agent, or Firm* — Dinsmore & Shohl LLP

(57) ABSTRACT

An assembly that includes a first substrate, a second substrate, and a stress mitigation layer disposed between the first and the second substrates. The stress mitigation layer is directly bonded onto the second substrate, and the second substrate is separated from the intermetallic compound layer by the stress mitigation layer. The stress mitigation layer has a high purity of at least 99% aluminum such that the stress mitigation layer reduces thermomechanical stresses on the first and second substrates. The assembly further includes an intermetallic compound layer disposed between the first substrate and the stress mitigation layer such that the stress mitigation layer is separated from the first substrate by the intermetallic compound layer.

20 Claims, 3 Drawing Sheets

(52) U.S. Cl.
CPC ............... *H01L 2224/29138* (2013.01); *H01L 2224/29147* (2013.01); *H01L 2224/29155* (2013.01); *H01L 2224/32245* (2013.01); *H01L 2224/32503* (2013.01); *H01L 2224/33181* (2013.01); *H01L 2224/48091* (2013.01); *H01L 2224/48175* (2013.01); *H01L 2224/73215* (2013.01); *H01L 2224/73265* (2013.01); *H01L 2224/83895* (2013.01); *H01L 2924/10253* (2013.01); *H01L 2924/14* (2013.01); *H01L 2924/20106* (2013.01); *H01L 2924/20108* (2013.01); *H01L 2924/351* (2013.01)

(56) References Cited

U.S. PATENT DOCUMENTS

| | | |
|---|---|---|
| 9,807,865 B2 | 10/2017 | Nagatomo et al. |
| 9,818,716 B2 | 11/2017 | Fujino et al. |

OTHER PUBLICATIONS

Xie, et al. "Formation of Intermetallic Phases on the Bond Interface of Aluminum-Clad Copper" https://www.jstage.jst.go.jp/article/jinstmet/75/3/75_3_166/_article Jun. 20, 2018.

POWER ELECTRONIC ASSEMBLIES WITH HIGH PURITY ALUMINUM PLATED SUBSTRATES

TECHNICAL FIELD

The present specification generally relates to bonding materials for power electronics assemblies, and more particularly, to bonding materials that bond semiconductor devices to substrates and provide stress mitigation of the semiconductor devices.

BACKGROUND

Power electronic devices are often utilized in high-power electrical applications, such as inverter systems for hybrid electric vehicles and electric vehicles. Such power electronic devices include power semiconductor devices such as power IGBTs and power transistors that are thermally bonded to a substrate. With advances in battery technology and increases in electronic device packaging density, operating temperatures of power electronic devices have increased and exceed approximately 200° C. which result in increased thermomechanical stresses endured by the power electronic device. Accordingly, stress mitigation structures or materials for power electronic devices are desired.

SUMMARY

In one embodiment, an assembly includes a first substrate, a second substrate, and a stress mitigation layer disposed between the first and the second substrates. The stress mitigation layer is directly bonded onto the second substrate, and the second substrate is separated from the intermetallic compound layer by the stress mitigation layer. The stress mitigation layer has a high purity of at least 99% aluminum such that the stress mitigation layer reduces thermomechanical stresses on the first and second substrates. The assembly further includes an intermetallic compound layer disposed between the first substrate and the stress mitigation layer such that the stress mitigation layer is separated from the first substrate by the intermetallic compound layer.

In another embodiment, a power electronic assembly includes a metal substrate having a bonding surface, a semiconductor device having a corresponding bonding surface that is in electrical communication with the metal substrate, and a metallic interlayer bonded to the corresponding bonding surface of the semiconductor device. The assembly further includes a high-purity aluminum layer directly bonded to the bonding surface of the metal substrate and the metallic interlayer opposite of the metal substrate. The high-purity aluminum layer separates the metal substrate from the metallic interlayer and includes an elastic modulus of about 7 MPa to about 11 MPa. It should be understood that the elastic modulus of the aluminum varies based on a purity of the material. The high-purity aluminum is configured to mitigate stresses endured on the metal substrate.

In another embodiment, a process for manufacturing a power electronics assembly includes directly bonding an aluminum layer onto a substrate, wherein the aluminum layer comprises aluminum having a purity of at least 99%, and depositing a high melting temperature layer onto the aluminum layer. The process includes depositing a low melting temperature layer onto the high melting temperature layer opposite of the aluminum layer, wherein the low melting temperature layer has a melting temperature that is lower than the high melting temperature layer. The process further includes disposing a semiconductor device onto the low melting temperature layer opposite of the high melting temperature layer to assemble the power electronics assembly, and heating the power electronics assembly to melt the low melting temperature layer and diffuse the low melting temperature layer into at least the semiconductor device and the high melting temperature layer. An intermetallic compound layer is formed between the semiconductor device and the aluminum layer such that the intermetallic compound layer bonds the semiconductor device to the aluminum layer. The aluminum layer provides stress mitigating characteristics between the semiconductor device and the substrate.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
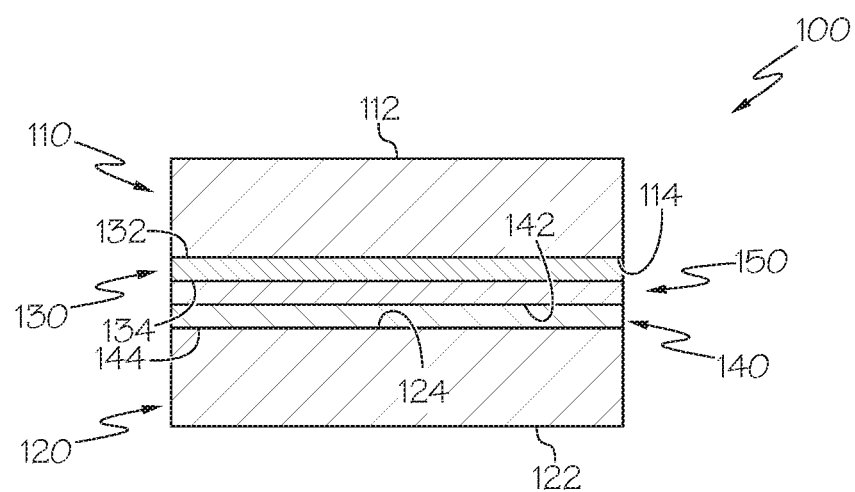
FIG. 1 schematically depicts a cross sectional view of a bonding assembly having a pair of substrates bonded to one another with a stress mitigation layer according to one or more embodiments shown and described herein.

Embodiments of the present disclosure are directed to bonding assemblies and methods of bonding substrates of an assembly including a bond layer comprising an intermetallic compound layer formed by transient liquid phase bonding and a stress mitigation layer. In embodiments, the stress mitigation layer is a high purity aluminum layer that is directly bonded to a first substrate.

Transient liquid phase bonding is a joining-process utilized to bond metallic systems together, such as a bonding assembly including a pair of substrates (e.g., a power electronic assembly including a power semiconductor device). During the transient liquid phase bonding process, low melting temperature materials (e.g., tin, indium, bismuth, and the like) and high melting temperature materials (e.g., copper, silver, magnesium, nickel, and the like) are disposed between first and second substrates to be bonded. The low and high melting temperature materials may be provided in a variety of forms. As one non-limiting example, one or more alternating thin film layers of the low melting temperature material and the high melting temperature material are provided. As another non-limiting example, the low and high melting temperature materials may be provided as particles, such as individual particles of low and high melting temperature materials, or particles having a core and one or more shells of the low and high melting temperature materials.

To bond the pair of substrates by transient liquid phase bonding, the assembly is heated to a sintering temperature of about 280° Celsius to about 350° Celsius, which causes the low melting temperature material to melt and form intermetallic bonds with the high melting temperature material. The result is an intermetallic compound bond layer having a re-melting temperature that is greater than the sintering temperature (e.g., at least about 300° Celsius to about 360° Celsius). Thus, the high re-melting temperature intermetallic compound bond layer may be ideal for power electronic device applications where a semiconductor device operates at high operating temperatures, such as greater than 200° Celsius.

Although transient liquid phase bonding layers comprising an intermetallic compound layer have a high re-melting temperature, these layers may be brittle and may crack due to thermally induced stress caused by operation of the semiconductor device. Thus, it may be beneficial to include one or more stress-mitigating layers in between intermetallic compound layers formed by transient liquid phase bonding.

Stress mitigating layers may be formed of aluminum, with intermetallic compound layers positioned above and below the aluminum layer such that the aluminum layer is spaced apart from the pair of substrates by the intermetallic compound layers. Aluminum, and in particular high purity aluminum, has a low Young's modulus (e.g., about 7 MPa to about 11 MPa) that is lower than that of the intermetallic compound layer(s), and may therefore allow the assembly to flex and bend when the assembly is operated at high operating temperatures. Therefore, aluminum may be useful as a stress mitigation layer.

Further, additional layers may be included within the power electronic assembly and positioned about the aluminum layer, such as nickel, such that the nickel layers further separate the aluminum layer from the pair of substrates. The nickel layers may be disposed between the aluminum layer and the intermetallic compound layers that are positioned relatively above and below the aluminum layer such that the nickel layer is bonded directly against the aluminum layer.

However, with the inclusion of numerous metallic interlayers (i.e., the pair of intermetallic compound layers, the pair of nickel layers, the aluminum layer, etc.), the power electronic assemblies may experience high thermal resistance at the interfaces of the various layers. The numerous metallization layers may contribute to a limited lifespan for the power electronic assembly.

Embodiments of the present disclosure reduce the number of layers in the bonding assembly to reduce the overall thermal resistance of the power electronics assembly. As will be described in greater detail herein, including a high-purity stress mitigation layer within the bonding assembly may contribute to minimizing the quantity of metallization layers disposed within the bonding assembly, thereby minimizing the thermal resistance of the bonding assembly and increasing its expected lifespan.

More particularly, power electronics assemblies including a pair of substrates bonded to one another with a stress mitigation layer are provided. As used herein, the term stress mitigation layer refers to a layer disposed between a pair of substrates, one of which may be a power semiconductor device, wherein the stress mitigation layer is directly bonded to one of the substrates and configured to mitigate thermomechanical stresses endured by the semiconductor device during operation of the bonding assembly (e.g., a power electronic assembly). The stress mitigation layer comprises a first surface and a second surface positioned opposite of the first surface, with the first surface bonded to a substrate and the second surface bonded to a single intermetallic layer disposed between the stress mitigation layer and the semiconductor device.

Figure 2:
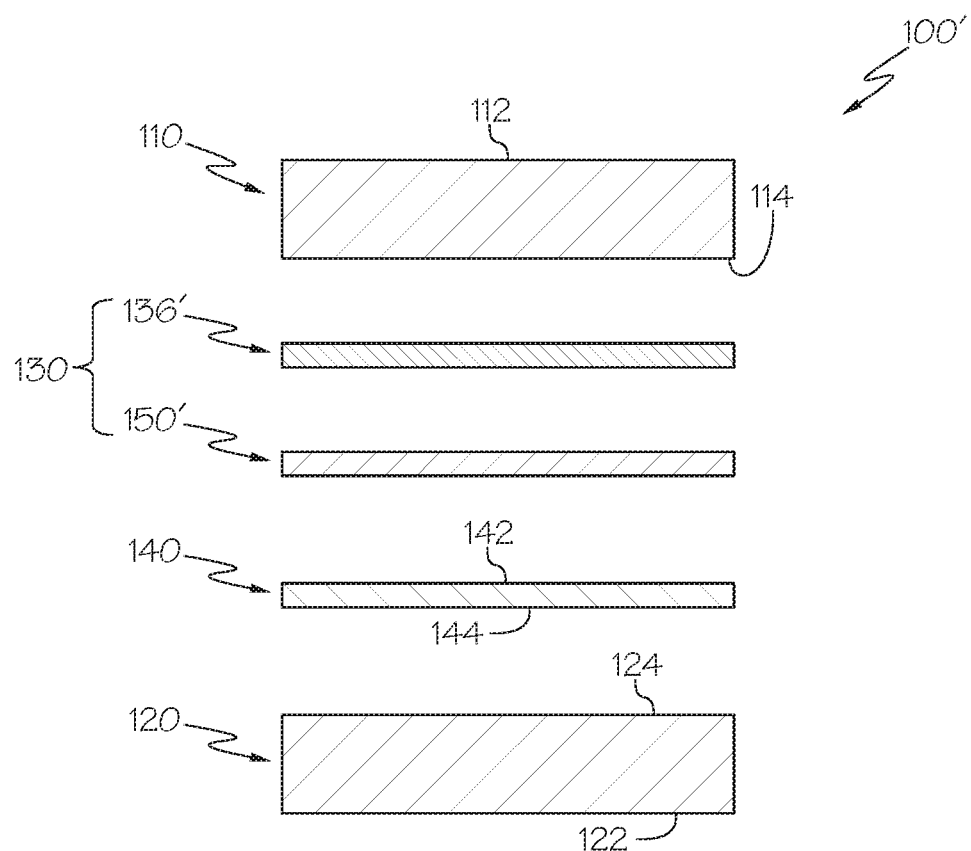
FIG. 2 schematically depicts an exploded cross sectional view of a pre-bonded state of the bonding assembly of FIG. 1 according to one or more embodiments shown and described herein.

Referring now to FIG. 1, as a non-limiting example, a bonding assembly 100, such as, for example, a power electronics assembly, is schematically illustrated. The bonding assembly 100 generally comprises a first substrate 110 bonded to a second substrate 120 via a series of interlayers positioned therebetween. In embodiments, the series of interlayers positioned between the first substrate 110 and the second substrate 120 includes an intermetallic compound layer 130, a stress mitigation layer 140, and a high melting temperature layer 150. As described in more detail below, the high melting temperature layer 150 may or may not be present in the bonding assembly 100 following the transient liquid phase (TLP) bonding process. For example, an initial high melting temperature layer 150' (see FIG. 2 illustrating the bonding assembly 100' prior to the bonding process) may be fully incorporated into the intermetallic compound layer 130 following the TLP bonding process. In the present example, the first substrate 110 includes a nonbonding surface 112 and a bonding surface 114, and the second substrate 120 includes a nonbonding surface 122 and a bonding surface 124.

The first substrate 110 may be any component. In some embodiments, the first substrate 110 may be formed from a wide band gap semiconductor material suitable for the manufacture or production of power semiconductor devices such as power insulated-gate bipolar transistors (IGBTs) and power transistors. In some embodiments, the first substrate 110 may be formed from wide band gap semiconductor materials including without limitation silicon carbide (SiC), aluminum nitride (AlN), gallium nitride (GaN), boron nitride (BN), diamond, and the like.

The first substrate 110 may be power semiconductor devices such as IGBTs, power diodes, power metal-oxide-semiconductor field effect transistors (MOSFETs), power transistors, and the like. In one embodiment, the first substrate 110 of one or more power electronics assemblies are electrically coupled to form an inverter circuit or system for vehicular applications, such as for hybrid vehicles or electric vehicles, for example. It should be understood that although the first substrate 110 is referred to as a power semiconductor device in the present example, in some embodiments, the bonding assembly 100 may include other heat generating devices bonded to the second substrate 120. The first substrate 110 may be thermally coupled to the stress mitigation layer 140 via the intermetallic compound layer 130 disposed therebetween, and the second substrate 120 may be thermally coupled to the stress mitigation layer 140 via the direct bond with the stress mitigation layer 140 along the bonding surface 124 and the bottom surface 144. In other embodiments, the first substrate 110 is another device that generates heat.

The second substrate 120 may be any type of substrate capable of being bonded directly to the stress mitigation layer 140 such as, without limitation, substrates formed from copper (Cu), e.g., oxygen free Cu, aluminum (Al), Cu alloys, Al alloys, nickel, and the like. As will be described in greater detail herein, the second substrate 120 may be formed from a thermally conductive material such that heat from the first substrate 110 is transferred to the stress mitigation layer 140 that is interlaid between the first substrate 110 and the second substrate 120.

The stress mitigation layer 140 is directly bonded to the bonding surface 124 of the second substrate 120 and is positioned between the second substrate 120 and the high melting temperature layer 150. As used herein, the phrases "directly bonded" and "directly disposed" means that a first layer is disposed onto a surface of a second layer without any intermediary layers. In some embodiments, there is no remaining high melting temperature layer 150 such that the stress mitigation layer 140 is positioned between the second substrate 120 and the intermetallic compound layer 130. The stress mitigation layer 140 may have a thickness within a range of about 50 micrometers to about 100 micrometers. However, other thicknesses may be utilized.

In the present example, the stress mitigation layer 140 is formed of aluminum having a high purity. As used herein "high purity" aluminum means at least 99% aluminum. The stress mitigation layer 140 may have purity within a range of 99.0% to 99.99% aluminum. In the present example, purity of the stress mitigation layer 140 such that the high-purity aluminum is operable to be directly deposited onto the second substrate 120 to serve as an aluminum-plated, stress mitigation layer 140. It should be understood that the stress mitigation layer 140 may be electroplated onto the second substrate 120 by any electroplating process.

It has been found that high purity aluminum allows the stress mitigation layer 140 to be directly deposited on the bonding surface 124 of the second substrate 120, which allows for the elimination of an additional intermetallic layer between the second substrate 120 and the stress mitigation layer 140. As described herein, electroplating a substrate with high-purity aluminum provides enhanced performance for the bonding assembly 100, and in particular, improves the high temperature operability and longevity of the bonding assembly 100.

For instance, with the stress mitigation layer 140 being formed of high-purity aluminum, the stress mitigation layer 140 includes a relatively low stiffness. As used herein, the term stiffness refers to the elastic modulus (commonly referred to as Young's modulus) of a material, i.e. a measure of a material's resistance to being deformed elastically when a force is applied to the material. The stiffness of the stress mitigation layer 140 described herein can be varied by varying the purity of the material (i.e., the aluminum). Accordingly, a graded stiffness as a function of the purity of the stress mitigation layer 140 may be provided and controlled to accommodate thermal stress for a given bonding assembly (e.g., semiconductor device-frame combination). In some embodiments, the stress mitigation layer 140 may have an elastic modulus of about 7 MPa to about 11 MPa.

The high melting temperature layer 150 is disposed between the intermetallic compound layer 130 and the stress mitigation layer 140. In particular, the high melting temperature layer 150 is electroplated to a top surface 142 of the stress mitigation layer 140. As described in more detail below, the high melting temperature layer 150 is utilized to form the intermetallic compound layer 130 by transient liquid phase bonding. The high melting temperature layer 150 may be formed of a high melting temperature material (e.g., copper, nickel, silver, magnesium, etc.) used to form intermetallic bonds of the intermetallic compound layer 130.

The intermetallic compound layer 130 may comprise any intermetallic compounds formed by a TLP bonding process. As described below, the TLP process forms an intermetallic compound layer by melting one or more low melting temperature metals that then form intermetallic bonds with one or more high melting temperature materials having a higher melting temperature than the one or more low melting temperature materials.

In embodiments, the first substrate 110 is configured to generate thermal energy providing an increasing operating temperature, thereby producing thermomechanical stresses within the bonding assembly 100. Additionally, thermal mechanical stresses are similarly generated during the TLP bonding of the bonding assembly 100. In the present example, with the stress mitigation layer 140 being formed of aluminum having a purity of at least about 99%, the stress mitigation layer 140 is elastically deformable when a force is applied to the material, such as the thermomechanical stresses generated within the bonding assembly 100. Accordingly, with the stress mitigation layer 140 being directly plated over the second substrate 120, the stress mitigation layer 140 is configured to reduce the thermally induced stresses within the bonding assembly 100 (e.g., generated by the first substrate 110 and/or during TLP bonding), and in particular, to mitigate thermally induced stresses upon the second substrate 120 and/or the first substrate 110.

Further, with the stress mitigation layer 140 comprising a high purity aluminum, only a single intermetallic compound layer 130 is formed within the bonding assembly 100 during the TLP bonding of the first substrate 110 to the second substrate 120, rather than the bonding assembly 100 including two or more intermetallic compound layers 130 disposed therein. By including fewer intermetallic compound layers between the first substrate 110 and the second substrate 120, the stress mitigation layer 140 facilitates prolonged use of the bonding assembly 100, in addition to exhibiting the stress mitigation characteristics described above. Accordingly, the stress mitigation layer 140 is further configured to improve the prospective lifespan of the bonding assembly 100 by minimizing the quantity of intermetallic interlayers formed within the bonding assembly 100 during the TLP bonding process.

Figure 3:
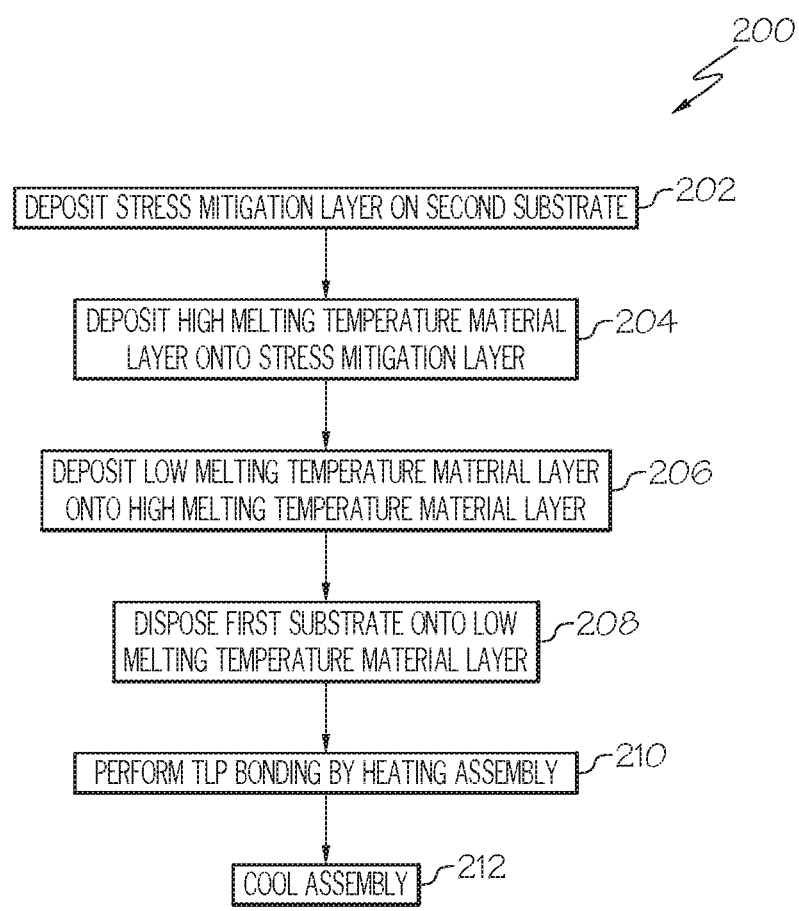
FIG. 3 is a flow chart of a method for fabricating the assembly of FIG. 1 according to one or more embodiments shown and described herein.

Referring now to FIG. 2 and the flowchart of FIG. 3, an example process 200 of bonding a first substrate 110 to a second substrate 120 is schematically illustrated. It should be understood that process 200 is merely illustrative and that the bonding assembly 100 may be formed in various other methods. First, at step 202, a stress mitigation layer 140 is directly bonded to a bonding surface 124 of the second substrate 120. As an example, the stress mitigation layer 140, which comprises high purity aluminum, is electroplated or sputtered onto the bonding surface 124 of second substrate 120 by any known or yet-to-be-developed electroplating and/or sputter process. It is noted that aluminum having a purity of less than 99% cannot be reliably electroplated onto a metal surface, such as a copper surface of the second substrate 120. In some embodiments, the stress mitigation layer 140 may be a film that is placed on the second substrate 120 along the bonding interface 124.

Next, at step 204, a high melting temperature layer 150' is deposited onto the stress mitigation layer 140 such that the stress mitigation layer 140 is disposed between the high melting temperature layer 150' and the second substrate 120. At step 206, a low melting temperature layer 136' is deposited onto the high melting temperature layer 150' along a surface of the high melting temperature layer 150' opposite of the stress mitigation layer 140. The high melting temperature layer 150' comprises a high melting temperature material suitable for TLP bonding having a melting temperature that is relatively higher than a melting temperature of the low melting temperature layer 136'. The high melting temperature material may be any high melting temperature material used in TLP processes, including, but not limited to, copper, nickel, silver, magnesium, etc. The low melting temperature material may be any low melting temperature material used in TLP processes, including, but not limited to, tin, indium, bismuth, etc.

It should be understood that FIG. 2 is merely an example, and that other configurations are possible. For example, multiple high and low melting temperature layers may be provided in multiple thin film layers. Alternatively, a paste comprising low and high melting particles (e.g., particles of a single metal or particles having a core and one or more shells of high and low melting temperature materials) may be provided instead of the low melting temperature layer 136' illustrated by FIG. 2.

Referring back to FIG. 3, at step 208, a bonding surface 114 of the first substrate 110 is positioned on the low melting temperature layer 136' (or paste/particle layer in other embodiments). It should be understood that in some embodiments the bonding surface 114 of the first substrate 110 may be coated with a metal or metal alloy layer or particles having a high melting temperature material, or otherwise provided with a high melting temperature material layer that forms intermetallic bonds with the low melting temperature layer 136' during the TLP process. For example, in some embodiments the bonding surface 114 of the first substrate 110 may be coated or otherwise provided with a high melting temperature material comprising copper, nickel, and/or the like.

After the layers are arranged as shown in FIG. 2, the bonding assembly 100 undergoes TLP bonding to thereby bond the first substrate 110 to the second substrate 120 with the stress mitigation layer 140 disposed therein. During the TLP bonding process, the bonding assembly 100 is heated to a sintering temperature of about 280° Celsius to about 300° Celsius, as seen at step 210. During the TLP bonding of the bonding assembly 100, edge portions of the low melting temperature layer 136' melt in response to the heating and thereby diffuse into both the adjacent metal layers (i.e., the high melting temperature layer 150' and the high temperature material coated along the bonding surface 114 of the first substrate 110). In particular, an element of the low melting temperature material layer 136' (i.e., a constituent of an alloy of the layer 136') is partially diffused into the adjacent the high melting temperature materials of the first substrate 110 and the high melting temperature layer 150'.

In this instance, intermetallic bonds occur between the low melting temperature layer 136' and the first substrate 110 and the low melting temperature layer 136' and the high melting temperature layer 150', thereby forming the intermetallic compound layer 130 (i.e., a bonding layer) extending between the first substrate 110 and the high melting temperature layer 150. The intermetallic compound layer 130 is formed as a result of the homogenization of an interface region between the high melting temperature layer 150 and the bonding surface 114 of the first substrate 110. As noted herein, in some embodiments there may be no remaining high melting temperature layer 150 disposed between the stress mitigation layer 140 and the first substrate 110 following the TLP bonding process such that the stress mitigation layer 140 is deposited directly against the bonding surface 114 of the first substrate 110.

The high purity aluminum (i.e., the stress mitigation layer 140) remains as an interlayer between the first substrate 110 and the second substrate 120. The resulting intermetallic compound layer 130 has a higher melting temperature relative to the stress mitigation layer 140 that remains disposed between the intermetallic compound layer 130 and the second substrate 120. At step 212, the bonding assembly 100 is cooled to thereby solidify the bonds between the high melting temperature materials and the low melting temperature materials of the bonding assembly 100, and in particular, the first substrate 110, the second substrate 120, and the stress mitigation layer 140. Upon cooling the bonding assembly 100, the intermetallic compound layer 130 is solidified by virtue of isothermal solidification. It should be understood that other configurations and examples of the arrangement of the bonding assembly 100 may be used to provide the stress mitigation characteristics of the stress mitigation layer 140 described above.

Figure 4:
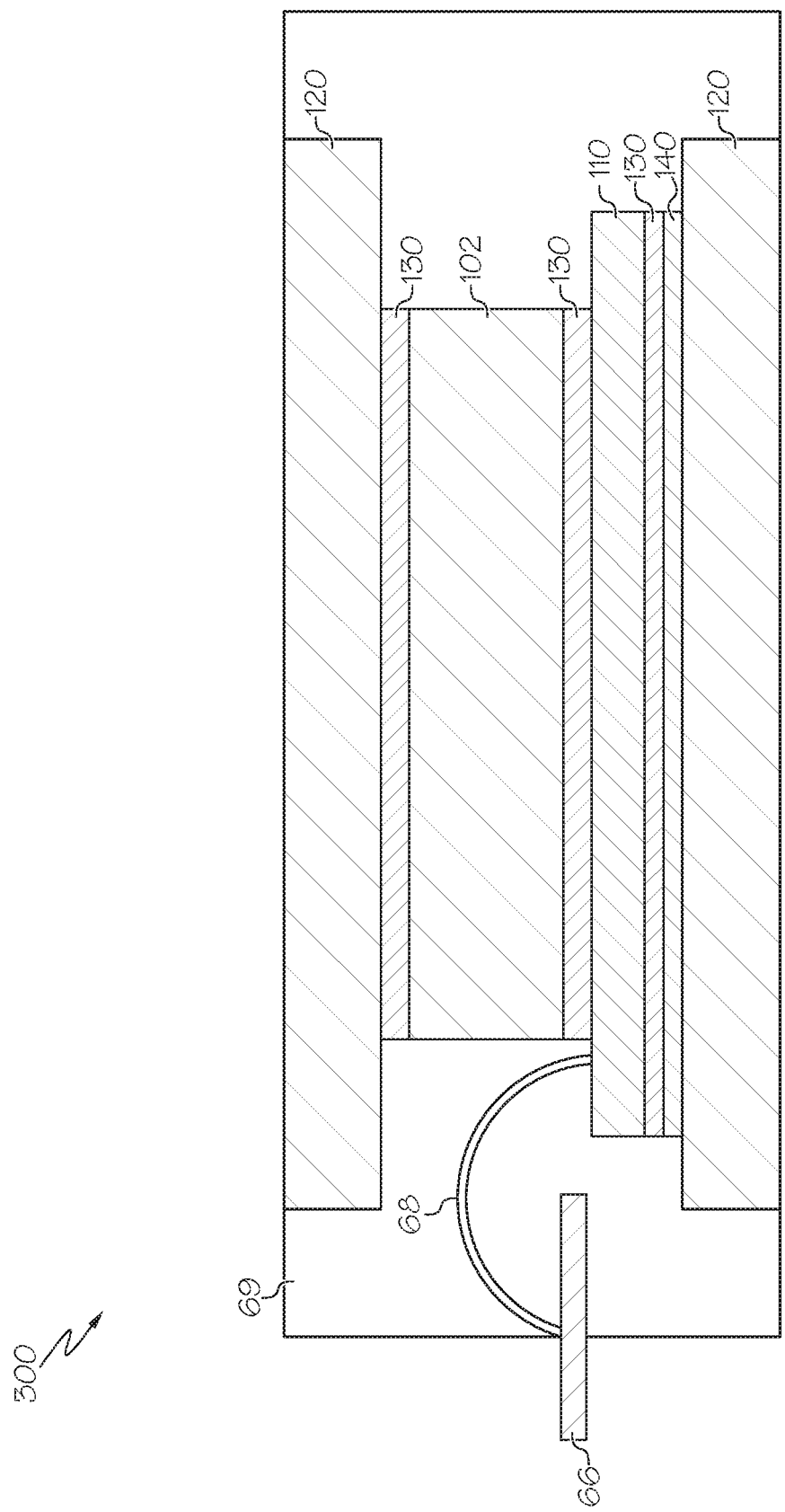
FIG. 4 schematically depicts a cross-sectional view of another assembly forming a double-sided cooling structure according to one or more embodiments shown and described herein.

Referring now to FIG. 4, a non-limiting example of a bonding assembly 300 (e.g., a power electronics assembly) is schematically illustrated having a double-sided cooling of the first substrate 110 (e.g., power electronic device). Except for the differences explicitly noted herein, it should be understood that the bonding assembly 300 is similar to the assembly described above such that the bonding assembly 300 may be configured and operable just like the bonding assembly 100. Accordingly, identical components are marked with the same reference numerals. It should be understood that any components and operabilities of the bonding assembly 300 that are not explicitly described below may be the same as the components and operabilities of the bonding assembly 100 described above.

The bonding assembly 300 described herein may include at least one first substrate 110 within a stack of thermally coupled components. The first substrate 110 may form one or more layers positioned between one or more additional layers that include substrates, bond layers, spacer layers, and/or the like. For example, the bonding assembly 300 described herein includes a pair of second substrates 120 disposed about opposing ends of the bonding assembly 300 with the first substrate 110 disposed therein. In particular, the stress mitigation layer 140 is deposited along the bonding surface 124 of the second substrate 120 and the first substrate 110 is bonded to the stress mitigation layer 140 with an intermetallic compound layer 130 disposed therebetween. The intermetallic compound layer 130 is formed between the first substrate 110 and the stress mitigation layer 140 in response to the first substrate 110 being transient liquid phase (TLP) bonded to the second substrate 120 as described in detail above. It should be understood that a low melting temperature material (e.g., low melting temperature material 136') positioned between the first substrate 110 and the stress mitigation layer 140 is melted and diffused into the adjacent layers, as previously described above, to thereby form the intermetallic compound layer 130 in response to the bonding assembly 300 undergoing TLP bonding.

The first substrate 110 is further bonded to a spacer layer 150, along a nonbonding surface 112 of the first substrate 110 which is opposite of the bonding surface 114 that is bonded to the stress mitigation layer 140, via the intermetallic compound layer 130 disposed therebetween. Similarly, an intermetallic compound layer 130 is disposed between the first substrate 110 and the spacer layer 150 as a result of the first substrate 110 undergoing TLP bonding with the spacer 150 with a low melting temperature material disposed therebetween. In this instance, the first substrate 110 is disposed between a pair of intermetallic compound layers 130, respectively. The other of the pair of second substrates 120 disposed within the bonding assembly 300 is deposited onto a top surface of the spacer 150, opposite of the bottom surface that is bonded to the first substrate 110. In this instance, the second substrate 120 is bonded thereto via an intermetallic compound layer 130.

The spacer layer 150 may include a spacer material that is capable of electric and thermal conduction, such as but not limited to, copper, aluminum, nickel, gallium, or any other metal, alloy, or compound that is capable of electrical and/or thermal conduction. It should be understood that the spacer 150 is sized and shaped to accommodate for the attachment of a wire 68 to the first substrate 110 (e.g. power electronic device) of the assembly 300. In this instance, the spacer 150 is configured to provide a clearance between the first substrate 110 and the other of the pair of second substrates 120 to thereby expose a portion (e.g., nonbonding surface 112) of the first substrate 110 for connection with the wire 68.

The pair of second substrates 120 may be a thermally conductive metal, a semiconductor material, an electrode, and/or the like. In some embodiments, the first of the pair of second substrates 120 may be a collector terminal of the bonding assembly 300 (e.g., power electronic assembly) and the second of the pair of second substrates 120 may be an emitter terminal of the bonding assembly 300. In some embodiments, the bonding assembly 300 may be thermally coupled to a cooling structure (not shown) along the outer surfaces of the bonding assembly 300, and in particular, at the pair of second substrates 120. The cooling structure may be a fluid cooler, heat sink, heat exchanger, vapor chamber, liquid-phase cooling apparatus, either active (e.g., utilizing jet channels and pumps), passive (e.g., utilizing thermal convection, conduction, radiation, including processes such as nucleation or the like), or a combination of both, or other cooling structure capable of removing heat from the bonding assembly 300. In some embodiments, the cooling structure may include an air-cooled heat sink or a liquid-cooled heat sink, such as a jet impingement or channel-based heat sink device. Additionally or alternatively, the pair of second substrates 120 of the bonding assembly 300 may further include a thermal grease coating disposed along surfaces of the each of the second substrates 120. In some embodiments, the second substrate 120 may be directly bonded to the cooling structure using a variety of bonding techniques, such as but not limited to TLP sintering, solder, brazing, or diffusion bonding, for example.

To compensate for increased thermal stresses endured within the bonding assembly 300, as caused by operation of the first substrate 110 (i.e., the power electronic device), the stress mitigation layer 140 is formed of high-purity aluminum. As described above, the high purity aluminum composition of the stress mitigation layer 140 exhibits a low Young's modulus that thereby promotes stress mitigating characteristics in the assembly 300 while also reducing the quantity of metallic layers formed in the assembly during TLP bonding. Accordingly, the stress mitigation layer 140 may mitigate thermomechanical stresses experienced within the bonding assembly 300 and may allow some flexibility in the stress mitigation layer 140 to compensate for the thermal stresses during temperature cycling of the first substrate 110. It should be understood that the bonding assembly 300 may include additional stress mitigation layers 140 disposed therein and positioned throughout the various layers of the bonding assembly 300 to provide enhanced compensation for the increased thermal stresses caused by the first substrate 110. For example, an additional stress mitigation layer 140 may be positioned between the top surface 102 of the first substrate 110 and the spacer 150.

The bonding assembly 300 may include a gate electrode 66 that is electrically coupled to the first substrate 110. In the present example, the gate electrode 66 is electrically coupled to the first substrate 110 (e.g., power electronic device) via the wire 68 that is secured to the top surface 102 of the first substrate 110. It should be understood that in other embodiments the gate electrode 66 may be directly electrically coupled to the first substrate 110 such that the wire 68 is omitted. In some embodiments, a signal, such as a gate voltage, may be applied to the gate electrode 66 to cause the first substrate 110 to conduct such that the pair of second substrates 120 may be electrically coupled to one another. The bonding assembly 300 may further include a resin 69 that is configured to provide a supporting structure or package to the components of the bonding assembly 300. It should be understood that FIG. 4 depicts only one possible embodiment of a bonding assembly 300 and should not be limited to such components and configuration.

As stated above, the bonding assemblies 100, 300 described above may be incorporated into an inverter circuit or system that converts direct current electrical power into alternating current electrical power, and vice versa, depending on the particular application. Power semiconductor devices utilized in such vehicular applications may generate a significant amount of thermally induced stresses during operation thereby requiring cooling of the semiconductor devices. The stress mitigation layer described above and illustrated herein may be bonded to the bonding assembly to mitigate the thermomechanical stresses generated by a semiconductor device to thereby cool the assembly while also providing a compact package design due to the reduction in metallic interlayers disposed therein.

It should now be understood that the stress mitigation layer in the bonding assembly (e.g., power electronics assembly) and vehicles described herein may be utilized for mitigating thermally induced stresses endured by the assembly. Particularly, the stress mitigation layers described herein may be bonded to substrates that generate thermomechanical stresses during operation and/or bonding, and the stress mitigation layers are formed of high-purity aluminum that exhibit a low Young's modulus that thereby promotes stress mitigating characteristics in the assembly while also reducing the quantity of metallic layers formed in the assembly during TLP bonding.

It is noted that the term "about" and "generally" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue. The terms "lower", "upper" and "middle" are used in relation to the figures and are not meant to define an exact orientation of 2-in-1 power electronics assemblies or layers used to form 2-in-1 electronic assemblies described herein.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:
1. An assembly comprising:
a first substrate;
a second substrate;

a stress mitigation layer disposed between the first and the second substrates, wherein:
the stress mitigation layer is directly bonded onto the second substrate, and
the second substrate is separated from the intermetallic compound layer by the stress mitigation layer; and
the stress mitigation layer has a high purity of at least 99% aluminum such that the stress mitigation layer reduces thermomechanical stresses on the first and second substrates; and
an intermetallic compound layer disposed between the first substrate and the stress mitigation layer such that the stress mitigation layer is separated from the first substrate by the intermetallic compound layer.

2. The assembly of claim 1, wherein the first substrate is a semiconductor device.

3. The assembly of claim 1, wherein the stress mitigation layer is formed of aluminum having a purity of at least 99.0%.

4. The assembly of claim 1, wherein the stress mitigation layer is formed of aluminum with at least 99.99% purity.

5. The assembly of claim 1, wherein the first substrate comprises silicon.

6. The assembly of claim 1, wherein the second substrate comprises copper or nickel.

7. The assembly of claim 1, wherein the second substrate is in electrical communication with the first substrate through the stress mitigation layer.

8. The assembly of claim 1, wherein the stress mitigation layer comprises an elastic modulus of about 11 MPa or less.

9. The assembly of claim 1, wherein the intermetallic compound layer comprises a bonding temperature of 300° Celsius or greater.

10. The assembly of claim 1, further comprising a high melting temperature layer disposed between the intermetallic compound layer and the stress mitigation layer.

11. The assembly of claim 10, wherein the high melting temperature layer comprises copper or nickel.

12. The assembly of claim 1, wherein the intermetallic compound layer comprises copper, nickel, or silicon.

13. A power electronic assembly comprising:
a metal substrate having a bonding surface;
a semiconductor device having a corresponding bonding surface, the semiconductor device is in electrical communication with the metal substrate;
a metallic interlayer bonded to the corresponding bonding surface of the semiconductor device;
a high-purity aluminum layer directly bonded to the bonding surface of the metal substrate and the metallic interlayer opposite of the metal substrate, wherein the high-purity aluminum layer separates the metal substrate from the metallic interlayer, the high-purity aluminum layer comprises an elastic modulus of about 7 MPa to about 11 MPa and is configured to mitigate stresses endured on the metal substrate.

14. The power electronic assembly of claim 13, wherein the high-purity aluminum layer comprises at least 99% aluminum.

15. The power electronic assembly of claim 13, wherein the metallic interlayer comprises copper or nickel.

16. The power electronic assembly of claim 13, further comprising a high melting temperature layer disposed between the intermetallic compound layer and the stress mitigation layer.

17. The power electronic assembly of claim 16, wherein the high melting temperature layer comprises copper or nickel.

18. A process for manufacturing a power electronics assembly comprising:
directly bonding an aluminum layer onto a substrate, wherein the aluminum layer comprises aluminum having a purity of at least 99%;
depositing a high melting temperature layer onto the aluminum layer;
depositing a low melting temperature layer onto the high melting temperature layer opposite of the aluminum layer, wherein the low melting temperature layer has a melting temperature that is lower than the high melting temperature layer;
disposing a semiconductor device onto the low melting temperature layer opposite of the high melting temperature layer to assemble the power electronics assembly; and
heating the power electronics assembly to melt the low melting temperature layer and diffuse the low melting temperature layer into at least the semiconductor device and the high melting temperature layer, wherein an intermetallic compound layer is formed between the semiconductor device and the aluminum layer such that the intermetallic compound layer bonds the semiconductor device to the aluminum layer; and
wherein the aluminum layer provides stress mitigating characteristics between the semiconductor device and the substrate.

19. The process of claim 18, further comprising diffusing the high melting temperature layer during the heating such that the intermetallic compound layer is directly bonded to the aluminum layer.

20. The process of claim 18, wherein the melting temperature of the low melting temperature layer is about 230° Celsius and a bonding temperature of the intermetallic compound layer formed by the diffusion of the low melting temperature layer is about 300° Celsius or greater.

* * * * *